US012578270B2

(12) United States Patent
Chen et al.

(10) Patent No.: US 12,578,270 B2
(45) Date of Patent: Mar. 17, 2026

(54) MASK CHARACTERIZATION METHODS

(71) Applicant: Taiwan Semiconductor Manufacturing Company, Ltd., Hsinchu (TW)

(72) Inventors: Chien-Cheng Chen, Hsinchu County (TW); Ping-Hsun Lin, New Taipei City (TW); Huan-Ling Lee, Hsinchu County (TW); Ta-Cheng Lien, Hsinchu County (TW); Chia-Jen Chen, Hsinchu County (TW); Hsin-Chang Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 955 days.

(21) Appl. No.: 17/316,003

(22) Filed: May 10, 2021

(65) Prior Publication Data

US 2022/0357660 A1      Nov. 10, 2022

(51) Int. Cl.
G01N 21/45          (2006.01)
G01Q 60/24          (2010.01)
G03F 7/00           (2006.01)

(52) U.S. Cl.
CPC ............. G01N 21/45 (2013.01); G01Q 60/24 (2013.01); G03F 7/70033 (2013.01); *G01N 2021/458* (2013.01)

(58) Field of Classification Search
CPC .. G01N 21/45; G01N 2021/458; G01Q 60/24; G03F 7/70033; G03F 1/84
See application file for complete search history.

(56) References Cited

U.S. PATENT DOCUMENTS 6,559,953 B1 *  5/2003  Davids ...................... G03F 1/84
                                                 356/521
10,697,852 B2 *  6/2020  Wegmann ............... G03F 7/706
                    (Continued)

FOREIGN PATENT DOCUMENTS

CN          103176372 A      6/2013
CN          105467769 A      4/2016
                    (Continued)

OTHER PUBLICATIONS

Chinese Office Action for Application No. 202110851395.6 Dated May 21, 2025.

(Continued)

*Primary Examiner* — Michael P LaPage
(74) *Attorney, Agent, or Firm* — Lippes Mathias LLP

(57)          ABSTRACT

A mask characterization method comprises measuring an interference signal of a reflection or transmission mask for use in lithography; and determining a quality metric for the reflection or transmission mask based on the interference signal. A mask characterization apparatus comprises a light source arranged to illuminate a reflective or transmissive mask with light whereby mask-reflected or mask-transmitted light is generated; an optical grating arranged to convert the mask-reflected or mask-transmitted light into an interference pattern; and an optical detector array arranged to generate an interference signal by measuring the interference pattern.

20 Claims, 9 Drawing Sheets

(56)                References Cited

U.S. PATENT DOCUMENTS

| 11,635,371 | B2* | 4/2023 | Park | G01J 9/00 |
| | | | | 356/128 |
| 2002/0171825 | A1* | 11/2002 | Krantz | G01N 21/95607 |
| | | | | 356/237.1 |
| 2003/0144819 | A1* | 7/2003 | Takeuchi | G03F 7/706 |
| | | | | 702/189 |
| 2004/0086791 | A1* | 5/2004 | Aoki | G03F 1/84 |
| | | | | 430/311 |
| 2004/0257587 | A1* | 12/2004 | Rosakis | G01B 9/0201 |
| | | | | 356/520 |
| 2005/0007601 | A1* | 1/2005 | Rosakis | G01B 11/303 |
| | | | | 356/521 |
| 2008/0231862 | A1* | 9/2008 | Haidner | G03F 7/70283 |
| | | | | 356/521 |
| 2010/0001199 | A1* | 1/2010 | Lee | B82Y 10/00 |
| | | | | 250/372 |
| 2010/0149548 | A1* | 6/2010 | Shmarev | G03F 7/70916 |
| | | | | 356/517 |
| 2012/0081684 | A1* | 4/2012 | Den Oef | G01N 21/95607 |
| | | | | 356/489 |

| 2015/0204729 | A1* | 7/2015 | Kusunose | G03F 1/84 |
| | | | | 356/521 |
| 2016/0123810 | A1* | 5/2016 | Ando | G01J 3/14 |
| | | | | 356/326 |
| 2016/0299121 | A1* | 10/2016 | Fu | G01B 9/02091 |
| 2019/0056655 | A1* | 2/2019 | Ekinci | G03F 1/84 |
| 2019/0212226 | A1* | 7/2019 | Wegmann | G01M 11/0271 |
| 2020/0394778 | A1* | 12/2020 | Yoshitake | G21K 7/00 |
| 2021/0374381 | A1* | 12/2021 | Ozcan | G06V 30/19173 |
| 2022/0308463 | A1* | 9/2022 | Ehm | G03F 7/70883 |
| 2022/0342325 | A1* | 10/2022 | Mengel | G03F 1/84 |

FOREIGN PATENT DOCUMENTS

| CN | 108603833 | A | 9/2018 |
| TW | 201736830 | A | 10/2017 |
| TW | 201740215 | A | 11/2017 |

OTHER PUBLICATIONS

Chinese Office Action for Application No. 202110851395.6, Dated Nov. 29, 2025.

* cited by examiner

Interference pattern

Reference interference signal($S_R$)

Target interference signal ($S_T$)

MASK CHARACTERIZATION METHODS

BACKGROUND

The following relates to extreme ultraviolet (EUV) lithography, to inline lithographic mask fabrication monitoring, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
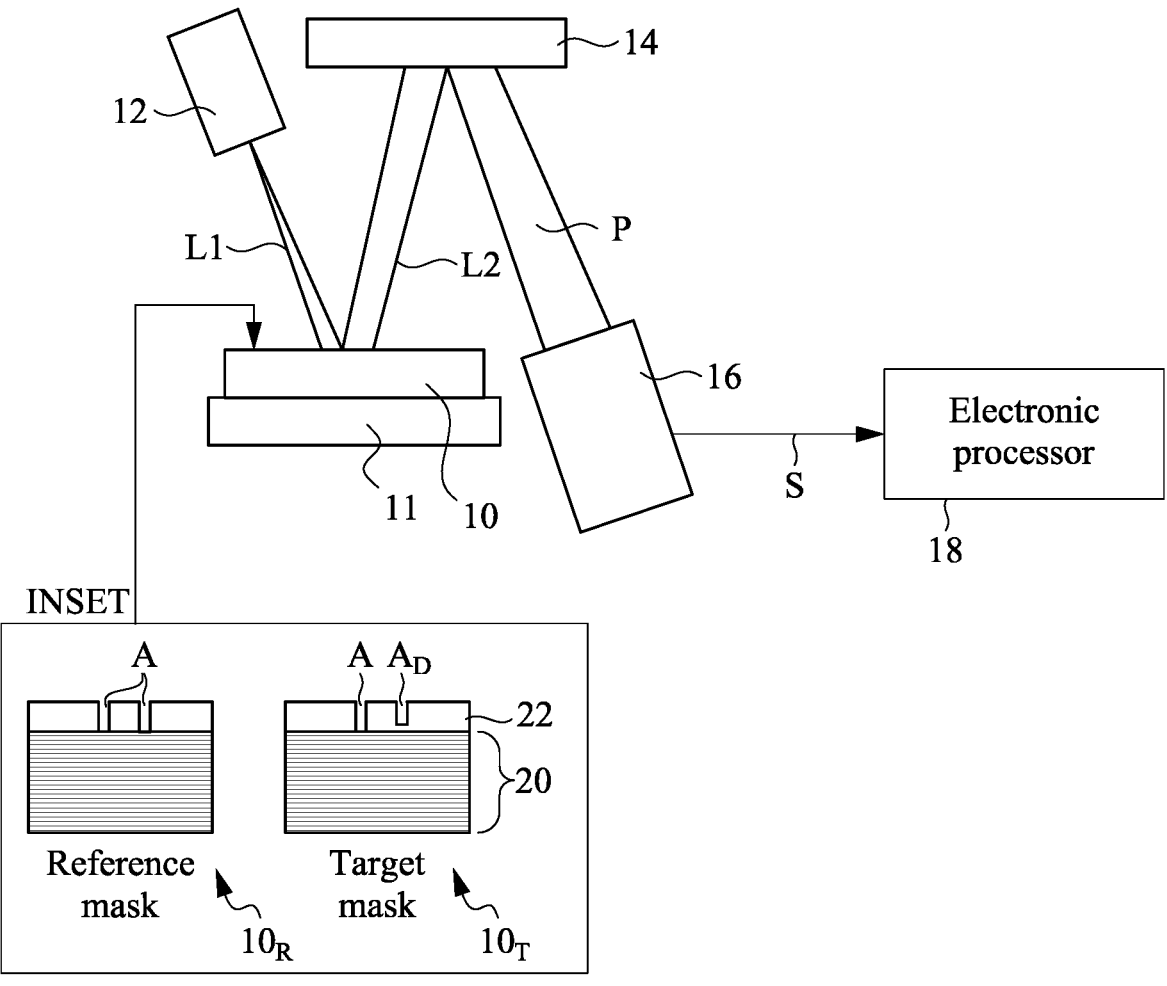
FIG. 1 diagrammatically illustrates a mask characterization apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The optical properties of thin films of a lithographic mask have an impact on lithography performed using the mask. Optical properties of films on an EUV lithography mask blank are typically measured using a synchrotron EUV source prior to mask fabrication. However, this approach is difficult to deploy as an inline monitor during the mask manufacturing process. Atomic force microscopy (AFM) can be used to characterize the mask during various stages of manufacturing or at end-of-manufacturing, but while AFM provide surface structural feature information it is not so informative as to the optical behavior of the processed films. Additionally, AFM is a slow technique.

With reference to FIG. 1, a mask characterization apparatus for characterizing a reflective mask 10 is diagrammatically illustrated. The mask 10 is also sometime referred to as a reticle, these terms considered to be interchangeable herein. A light source 12 is arranged to illuminate the reflective mask 10 disposed on a mount 11 (for example, an electrostatic chuck or e-chuck which is suitable for use in a vacuum environment) with light L1, which is reflected by the mask 10 to generate mask-reflected EUV light L2. In some embodiments, the light source 12 is an extreme ultraviolet (EUV) light source, where the EUV spectral range is 10 nm to 124 nm inclusive (10 eV to 124 eV inclusive). In some embodiments, the light L1 output by the light source 12 has a maximum spectral peak at a wavelength of 100 nm or shorter. It is contemplated that the maximum spectral peak at a wavelength of 100 nm or shorter may be shorter than 10 nm, e.g. the maximum spectral peak at a wavelength of 100 nm or shorter could, for example, be 1 nm. It is contemplated that the light L1 with maximum spectral peak at a wavelength of 100 nm or shorter may be X-ray radiation. In some more embodiments suitable for EUV lithography processes operating at 13.4-13.6 nm, the light L1 output by the light source 12 may have a maximum spectral peak in the spectral range 13.4-13.6 nm inclusive. These are merely non-limiting illustrative examples, and the light L1 could alternatively have a maximum spectral peak in another wavelength range such in the higher-wavelength ultraviolet range (e.g., in the range 10 nm to 400 nm inclusive), the visible spectral range (e.g., in the range 400-700 nm inclusive, that is, light L1 could be visible light) or the infrared spectral range.

The mask characterization apparatus of FIG. 1 further includes an optical grating 14 arranged to convert the mask-reflected light L2 (which is EUV light if the light L1 is EUV light) into an interference pattern P. An optical detector array 16 is arranged to generate an interference signal S by measuring the interference pattern P. An electronic processor 18 is programmed to determine a quality metric for the reflective mask 10 based (at least) on the interference signal S. The electronic processor 18 may in various non-limiting illustrative embodiments comprise a computer or other microprocessor-based digital data processing device, a microcontroller, or so forth, and may include suitable ancillary components such as one or more analog-to-digital converters to convert the signal S to a digital representation, a display, loudspeaker, and/or other device or devices for generating a human-perceptible representation of the quality metric, and/or so forth.

In general, the light source 12 may include an optical train (not shown) comprising one or more reflective and/or refractive optical elements arranged to shape and direct the light beam L1 onto the mask 10. In embodiments in which the light source 12 outputs light L1 as EUV light, the light source may be embodied in various ways. For example, the light source 12 may comprise a free electron laser (FEL) source or a high harmonic generation (HHG) EUV source which outputs spatially coherent light, or a laser-produced plasma (LPP) EUV light source, such as a pulsed tin plasma EUV light source, in conjunction with spatial filtering, or a synchrotron light source. In embodiments in which the light source 12 outputs light L1 as EUV light, the optical train is typically constructed using reflective optics. In some non-limiting embodiments, the light source 12 comprises a EUV light source that does not include a synchrotron.

The optical grating 14 is designed for the light L1 output by the light source 12. As a non-limiting illustrative example in which the light source 12 outputs light L1 as EUV light, the optical grating 14 is suitably a reflection EUV grating. The optical detector array 16 is likewise designed for the light L1 output by the light source 12. As a non-limiting illustrative example in which the light source 12 outputs light L1 as EUV light, the optical detector array 16 may suitably be a charge-coupled device (CCD) array, a CMOS detector array, or other EUV-sensitive detector array.

Figure 2:
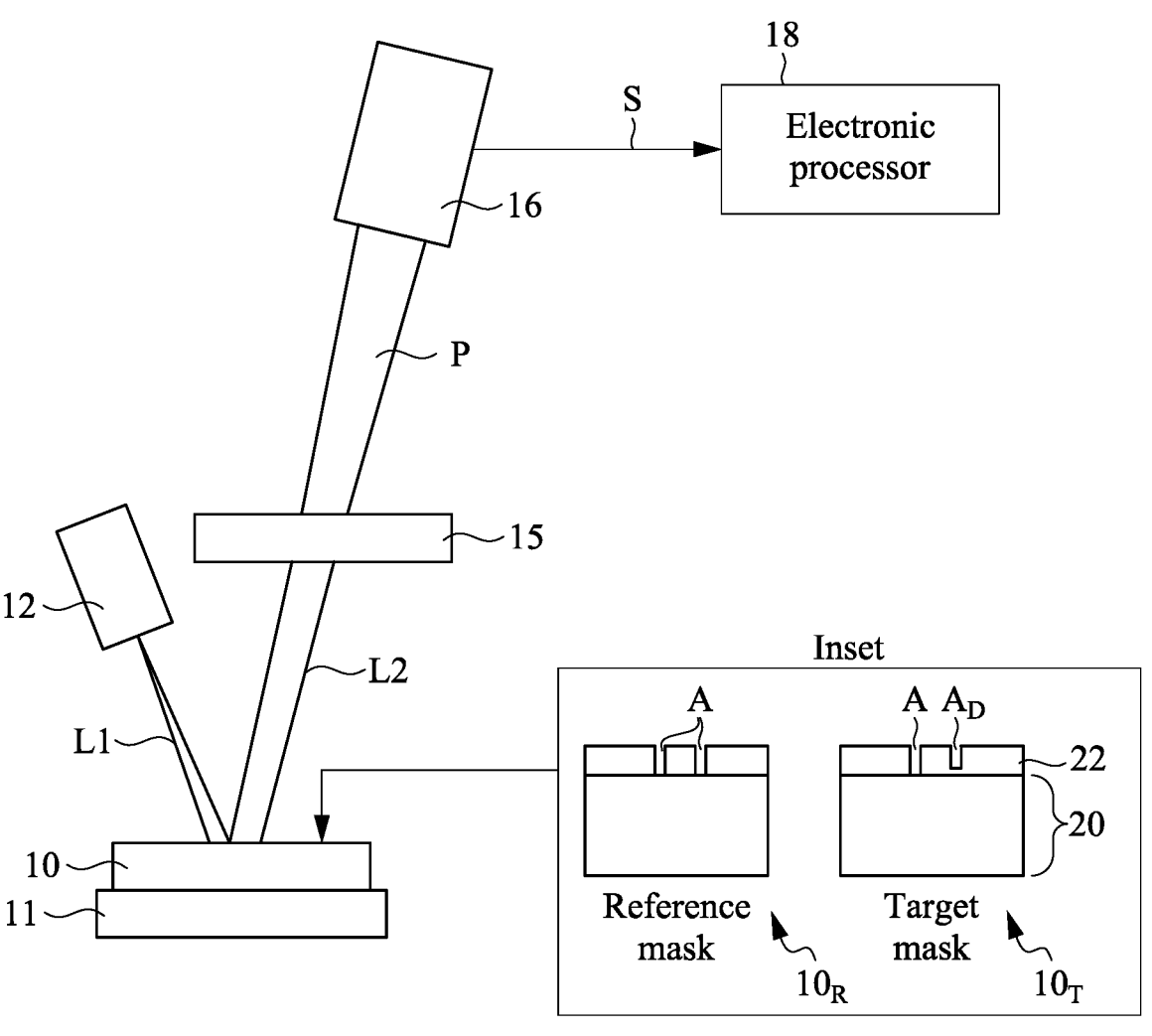
FIG. 2 diagrammatically illustrates a mask characterization apparatus in accordance with some embodiments.

The mask characterization device of FIG. 1 employs a reflection optical grating 14. With brief reference to FIG. 2, a mask characterization device according to a different embodiment is shown. The mask characterization device of FIG. 2 again includes the light source 12 arranged to illuminate the reflective mask 10 disposed on the mount 11 with light L1, which is reflected by the mask 10 to generate mask-reflected EUV light L2. In the embodiment of FIG. 2, however, an optical grating 15 is a transmission optical grating which is arranged to convert the mask-reflected light L2 into the interference pattern P by way of light transmission through the transmission optical grating 15. As in the embodiment of FIG. 1, the optical detector array 16 is arranged to generate the interference signal S by measuring the interference pattern P, and the electronic processor 18 is programmed to determine a quality metric for the reflective mask 10 based (at least) on the interference signal S. The transmission optical grating 15 is again designed for the light L1 output by the light source 12. As a non-limiting illustrative example in which the light source 12 outputs light L1 as EUV light, the transmission optical grating 15 is suitably a transmission EUV grating.

Figure 3:
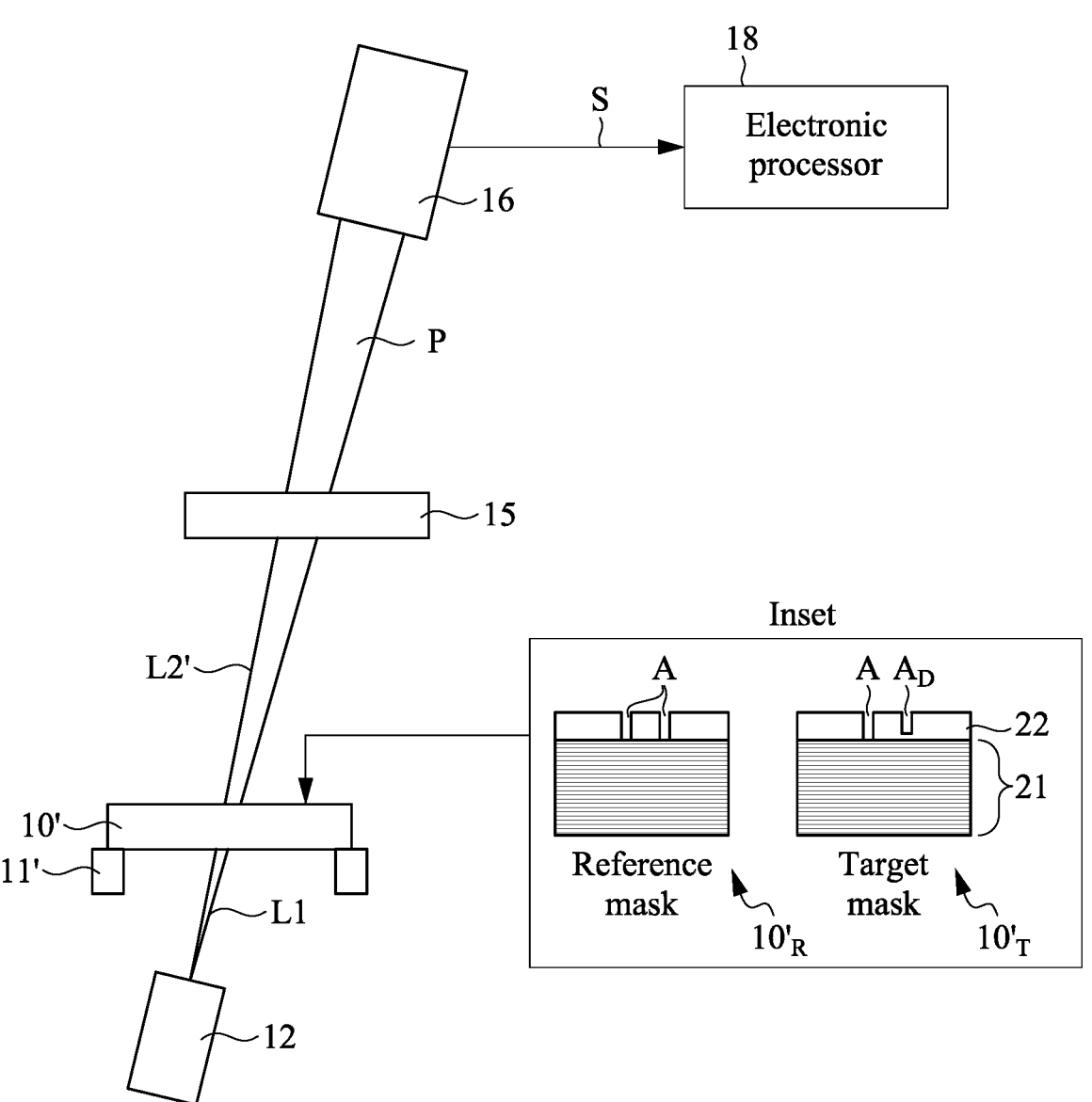
FIG. 3 diagrammatically illustrates a mask characterization apparatus in accordance with some embodiments.

The mask characterization devices of FIGS. 1 and 2 are configured to characterize a reflection mask 10. With brief reference to FIG. 3, a mask characterization device according to a different embodiment is shown. The mask characterization device of FIG. 3 is similar to the mask characterization device of FIG. 2, except that the reflection mask 10 being characterized is replaced by a transmission mask 10', which is mounted on a mount 11' with a central opening or the like to permit the light source 12 to transmit light L1 through the light-transmissive mask 10' to generate mask-transmitted EUV light L2'. A transmission mask is typically used in visible light photolithography, for example. As in the embodiments of FIGS. 1 and 2, the optical detector array 16 is arranged to generate the interference signal S by measuring the interference pattern P, and the electronic processor 18 is programmed to determine a quality metric for the transmission mask 10' (in this embodiment) based (at least) on the interference signal S. The transmission optical grating 15 is again designed for the light L1 output by the light source 12.

Although not illustrated, it will be appreciated that in yet another variant embodiment, a mask characterization apparatus for characterizing the transmission mask 10' of FIG. 3 could employ the reflection optical grating 14 of FIG. 1 instead of the transmission optical grating 15.

With reference back to FIGS. 1 and 2, an Inset diagrammatically shows two illustrative reflective masks 10, more specifically referred to herein as a reference mask $10_R$ and a target mask $10_T$. The illustrative masks $10_R$ and $10_T$ are reflection lithographic masks suitably used in lithography, and include a reflective multilayer stack 20 disposed on a substrate (not shown), and an absorbing layer 22 disposed on the reflective multilayer stack 20. More particularly, the reflective multilayer stack 20 is reflective for the light L1, while the absorbing layer 22 is absorbing for the light L1. In an illustrative example in which the light L1 is EUV light, the EUV-reflective multilayer stack 20 may, for example, comprise alternating layers of silicon (Si) and molybdenum (Mo). In some more specific embodiments sometimes used in 13.5 nm EUV lithography, the reflective multilayer stack 20 may comprise 40 pairs of Si/Mo. The absorbing layer 22 for the case of a reflection EUV mask may, for example, comprise a layer of chromium (Cr), chromium nitride (CrN), chromium oxynitride (CrON), chromium carbon oxynitride (CrCON), or so forth, of sufficient thickness to absorb the EUV light L1 impinging on the absorbing layer 22. The mask 10 for EUV embodiments may include other features not shown in the Inset, such as a substrate of a low thermal expansion material (LTEM) such as titanium dioxide ($TiO_2$) or doped silicon dioxide ($SiO_2$) supporting the layers 20, 22, and/or an optional backside multilayer stack for facilitating securing the mask 10 with the electrostatic chuck 11. The mask 10 may also optionally include a structural support, and/or a protective pellicle. Moreover, it is to be appreciated that these are merely non-limiting illustrative examples of some suitable masks for EUV lithography—the structure of the reflective mask 10 is typically designed for the type of lithography for which it is to be used, e.g. for visible light photolithography the reflective multilayer stack may suitably be replaced by a single metal layer that is highly reflective for visible light, and likewise the absorbing layer may suitably be a material that is strongly absorbing for visible light.

Furthermore, the reflection mask 10 has features formed into the surface of the mask 10 that vary the reflectivity of the surface of the mask 10 for the light L1. For example, the illustrative reference and target masks $10_R$ and $10_T$ include areas A in which the absorbing layer 22 has been removed, for example by a process including electron beam writing and subsequent etching in the case of an EUV mask. To make the areas A maximally reflective for the light L1, the absorbing layer 22 is completely removed in these areas A to expose the underlying surface of the EUV-reflective multilayer stack 20 in the areas $A_D$. However, as illustrated, the target mask $10_T$ includes a defective area $A_D$ in which the absorbing layer 22 has not been completely removed. Hence, the defective area $A_D$ will absorb the EUV light L1, or at least the defective area $A_D$ will have reduced reflectivity for the EUV light L1 when compared with the areas A. The illustrative defective area $A_D$ may have been incompletely etched during the fabrication of the mask. More generally defective areas such as defective area $A_D$ may be defective (in the sense of having a reflectivity for light L1) that is different from the design-basis reflectivity) for various reasons, such as (but not limited to): incomplete etching (as illustrated); contamination with one or more particulates; post-fabrication formation of an oxide or other overlayer; various combinations thereof; and/or so forth.

With reference to FIG. 3, an Inset diagrammatically shows two illustrative transmission masks $10'$, more specifically referred to herein as a reference transmission mask $10'_R$ and a target transmission mask $10'_T$. The illustrative transmission masks $10'_R$ and $10'_T$ are transmission lithographic masks suitably used in lithography, and do not include the reflective multilayer stack 20 of the reflection masks $10_R$ and $10_T$ of the embodiments of FIGS. 1 and 2. Rather, the illustrative transmission masks $10'_R$ and $10'_T$ include the absorbing layer 22 disposed on a light-transmissive substrate 21. More particularly, the substrate 21 is transparent for the light L1, while the absorbing layer 22 is again absorbing for the light L1. Depending on the wavelength of the light L1, the substrate 21 may, for example, comprise quartz, titanium dioxide ($TiO_2$), doped silicon dioxide ($SiO_2$), or so forth.

Figure 4:
FIG. 4 diagrammatically illustrates an interference pattern that is measured by an optical detector array of a mask characterization apparatus in accordance with some embodiments.
Figure 4:
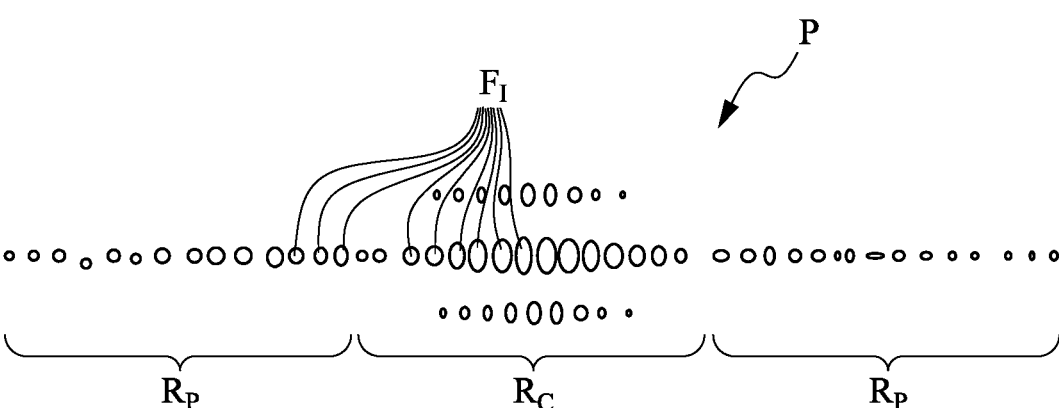
Figure 5:
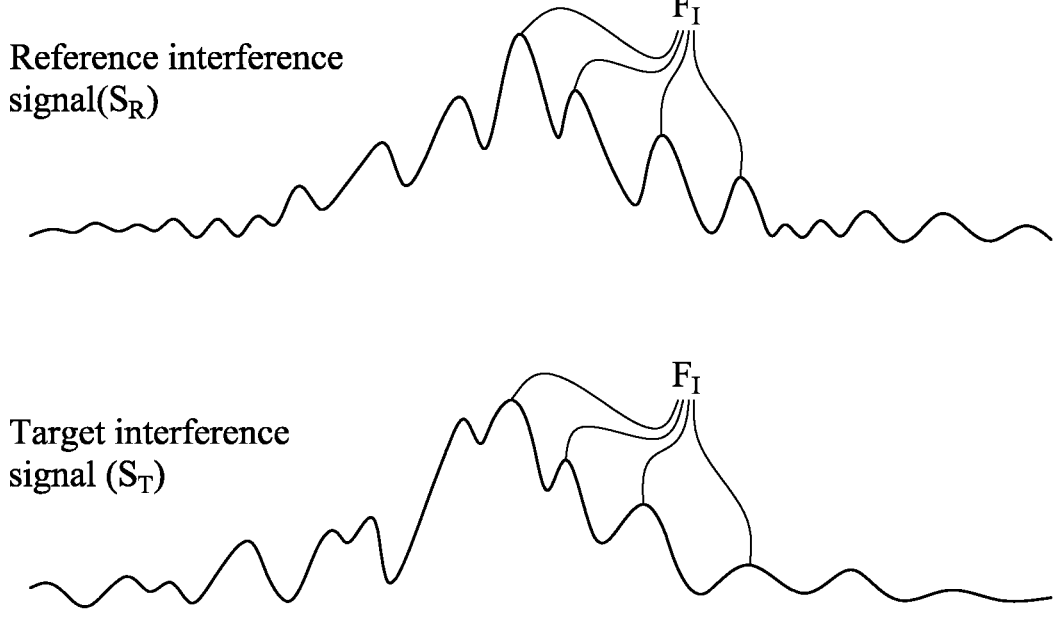
FIG. 5 diagrammatically illustrates reference and target interference signals that are measured by a mask characterization apparatus in accordance with some embodiments.

With reference to FIGS. 4 and 5, the interference pattern P (and the corresponding interference signal S measured by the optical detector array 16) typically has interference fringes $F_I$ at least in a central region $R_C$ of the interference pattern P, and a strong interference pattern may have fringes extending significantly into peripheral regions $R_P$ of the interference pattern P as well. FIG. 4 diagrammatically illustrates an example of the interference pattern P, while FIG. 5 diagrammatically illustrates a reference interference signal $S_R$ acquired by the mask characterization apparatus for the reference mask $10_R$ or $10'_R$ and also a target interference signal $S_T$ acquired by the mask characterization apparatus for the target mask $10_T$ or $10'_T$. The interference fringes $F_I$ are produced by the reflective areas A and $A_D$ of the mask 10. The interference fringes $F_I$ tend to be strongest when the areas A are of uniform reflectivity, and the strength of the interference fringes $F_I$ may also be enhanced by regularity in the lateral spacing of the areas A. On the other hand, the interference fringes $F_I$ may be shifted and/or weakened by defective areas such as the defective area $A_D$ that reduce the uniformity of the reflectivity, and the interference fringes $F_I$ may be shifted and/or weakened by defective areas that reduce the regularity of lateral spacing of the reflective areas.

More generally, the detailed shape and symmetry (or asymmetry) respective to the central region $R_C$ of the interference pattern P and corresponding interference signal S is strongly dependent on the detailed placement, geometry (e.g. size and shape), and reflectivity of the reflective areas A, $A_D$ of the mask 10. The number of interference fringes $F_I$, spacing of interference fringes $F_I$, strength (or weakness) of interference fringes $F_I$, and general positions of the interference fringes $F_I$ depends on the detailed layout and reflectivity of the reflective areas A, $A_D$ of the mask 10. Hence, as seen in FIG. 5, the reference interference signal $S_R$ for the reference mask $10_R$ or $10'_R$ exhibits strong and regular interference fringes $F_I$. By contrast, the target interference signal $S_T$ for the target mask $10_T$ or $10'_T$ exhibits weaker and less regular interference fringes $F_I$ when compared with the reference interference signal $S_R$. The difference between the reference and target interference signals $S_R$ and $S_T$ is due to the defective area $A_D$ of the target mask $10_T$ or $10'_T$.

The strength of the interference fringes $F_I$ measured for a given mask 10 is also dependent on the spatial coherence of the light L1. In general, and for a given mask 10, the interference fringes $F_I$ will be strongest in the case in which the light L1 is highly spatially coherent. By contrast, the interference fringes $F_I$ will be weakest or even nonexistent in the case in which the light L1 is incoherent. Accordingly, the light L1 may comprise spatially coherent light. For example, the light L1 preferably has spatial coherence effective for the interference pattern P to have interference fringes $F_I$ at least in the central region of the interference pattern P. To provide sufficient spatial coherence for the light L1, the light source 12 optionally may include a spatial filter to filter out selected spatial frequency components of the light and thereby increase the spatial coherence of the light L1 (albeit at the cost of reduced photon flux). Thus, for example, for characterization of EUV masks it is contemplated to embody the light source 12 as a LPP-EUV light source, such as a pulsed tin plasma EUV light source. The output of an LPP-EUV light source typically has relatively low coherence, but when used in conjunction with spatial filtering to improve the coherence can provide the light L1 with a suitably high spatial coherence to produce the interference pattern P with interference fringes $F_I$ at least in the central region of the interference pattern P. In another non-limiting illustrative embodiment for EUV mask characterization, the light source 12 may be an FEL EUV light source or an HHG EUV light source, which can output highly spatially coherent light without the use of spatial filtering.

The illustrative interference pattern P of FIG. 4, and the corresponding interference signals $S_R$ and $S_T$ of FIG. 5, are one-dimensional. Such a one-dimensional or linear interference pattern is obtained using a one-dimensional or linear optical grating as the optical grating 14 or 15, and in these embodiments the optical detector array 16 is also suitably a one-dimensional or linear detector array, e.g. with a one-dimensional line of CCD elements in the case of a CCD detector array. In other embodiments, the optical grating 14 or 15 is a two-dimensional optical grating, and the resulting interference pattern P is a two-dimensional interference pattern. In these embodiments, the optical detector array 16 is suitably a two-dimensional detector array, e.g. with a two-dimensional array of CCD elements in the case of a CCD detector array, to measure the two-dimensional interference pattern.

In general, the interference signal S measured for a particular mask 10 serves as a signature for that mask. To obtain the optical properties of the mask 10 based on the interference signal S, various approaches can be used.

Figure 6:
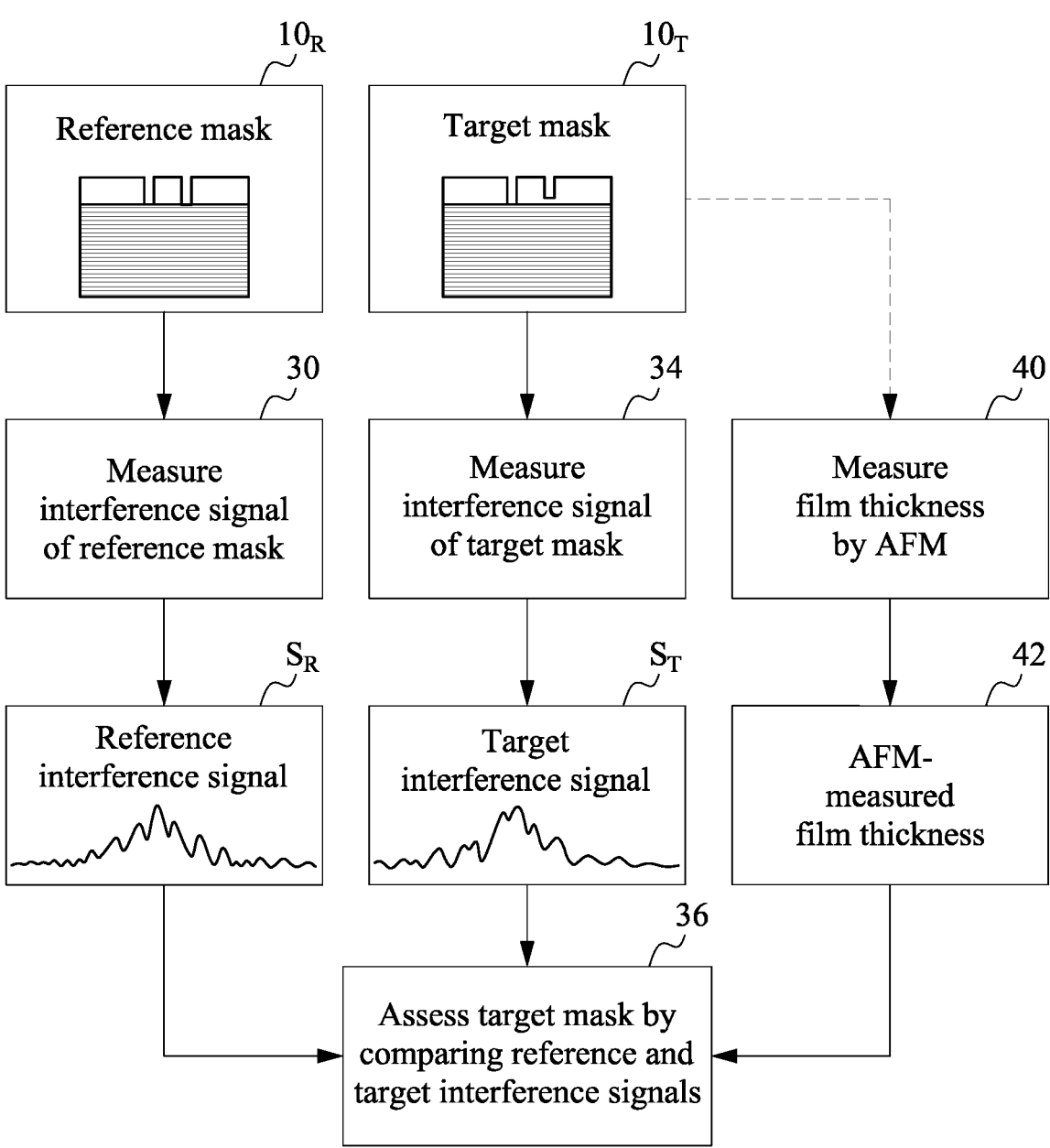
FIG. 6 diagrammatically illustrates a mask characterization method in accordance with some embodiments.

With reference to FIG. 6, in one approach a quality metric for the target reflective mask $10_T$ (or, equivalently, for the transmission mask $10'_T$) is determined debased on a comparison of the target interference signal $S_T$ and the reference interference signal $S_R$ measured for the reference mask $10_R$ (or, equivalently, for the reference transmission mask $10'_R$). In this approach, the reference mask $10_R$ is a standard (i.e. reference) mask whose reflective areas A are the intended design-basis for the target mask $10_T$ (or $10'_T$). For example, both the reference mask $10_R$ or $10'_R$ and the target mask $10_T$ or $10'_T$ may have been manufactured in the same batch to the same specifications in the same foundry. Optionally, the reference mask $10_R$ or $10'_R$ may be validated by one or more standard mask characterization approaches such as atomic force microscopy (AFM) and/or optical characterization using a synchrotron-based EUV light source at the mask manufacturing facility. In an operation 30, the interference signal $S_R$ of the reference mask $10_R$ (as shown, or $10'_R$ if a transmission mask is being characterized) is measured, for example using the mask characterization apparatus of FIG. 1 or FIG. 2 (or FIG. 3 for a transmission mask).

The target mask $10_T$ or $10'_T$ on the other hand, is intended for use in lithography processing, and may for example be undergoing testing prior to shipping to a customer or prior to deploying the target mask $10_T$ or $10'_T$ in a semiconductor lithography system. In an operation 34, the interference signal $S_T$ of the target reflection mask $10_T$ (or, equivalently, for the target transmission mask $10'_T$) is measured, for example using the mask characterization apparatus of FIG. 1 or of FIG. 2 (or FIG. 3 for a transmission mask). To maximize comparability between the two interference signals $S_R$ and $S_T$, in some embodiments the same mask characterization apparatus is used to measure both interference signals $S_R$ and $S_T$, although this is not necessary. In an operation 36, the target mask is assessed by comparing the reference and target interference signals $S_R$ and $S_T$. For example, a quality metric can be determined which is a measure of the similarity between the reference and target interference signals $S_R$ and $S_T$. In one approach for performing the operation 36, since the reference mask $10_R$ (or, equivalently, for the reference transmission mask $10'_R$) is known a priori to be acceptable, the closer the target interference signal $S_T$ is to the reference interference signal $S_R$, the higher value of the quality metric. If other information about the target mask $10_T$ (or, equivalently, transmission mask $10'_T$) is available, such as an AFM-measured film thickness 42 measured in an operation 40, then this additional information may optionally also be taken into account in determining the target mask quality in the operation 36.

An advantage of the approach of FIG. 6 is that it can be used for inline characterization of the target mask $10_T$ or $10'_T$. For example, the reference and target interference signals $S_R$ and $S_T$ can be measured for the respective reference and target masks at any stage of the mask fabrication process, and the two interference signals then compared to generate the quality metric providing the measure of the similarity between the reference and target interference signals $S_R$ and $S_T$ at that stage of the mask fabrication process. Likewise, the reference and target interference signals $S_R$ and $S_T$ can be measured for the respective reference and target masks at the end of the mask fabrication process, and the two interference signals then compared to generate the quality metric providing the measure of the similarity between the reference and target interference signals $S_R$ and $S_T$ at that the end of the mask fabrication process.

In a typical implementation for inline monitoring of the mask fabrication process, the reference mask measurement operation 30 is performed as in initial operation to generate the reference interference signal $S_R$. The reference interference signal $S_R$ is then stored, and can be retrieved at any subsequent time to perform an instance of the target mask assessment operation 36. Hence, the operation 30 is suitably performed once, and can thereafter be reused any time a mask fabrication process produces a target mask $10_T$ that is to be assessed by the inline mask characterization apparatus. Even more, the single stored reference interference signal $S_R$ can be retrieved and used in performing the target mask assessment operation 36 to assess any target mask that is expected to be comparable with the reference mask $10_R$ (e.g., any mask manufactured to the same specifications in the same foundry as the reference mask $10_R$).

Another advantage of the disclosed mask characterization is that it is fast as the measured interference signal characterizes the entire mask. By contrast, AFM entails slower raster scanning of the mask.

Another advantage of the disclosed mask characterization is that it uses relatively inexpensive components, especially when compared with existing mask characterization hardware such as a synchrotron EUV light source.

Figure 7:
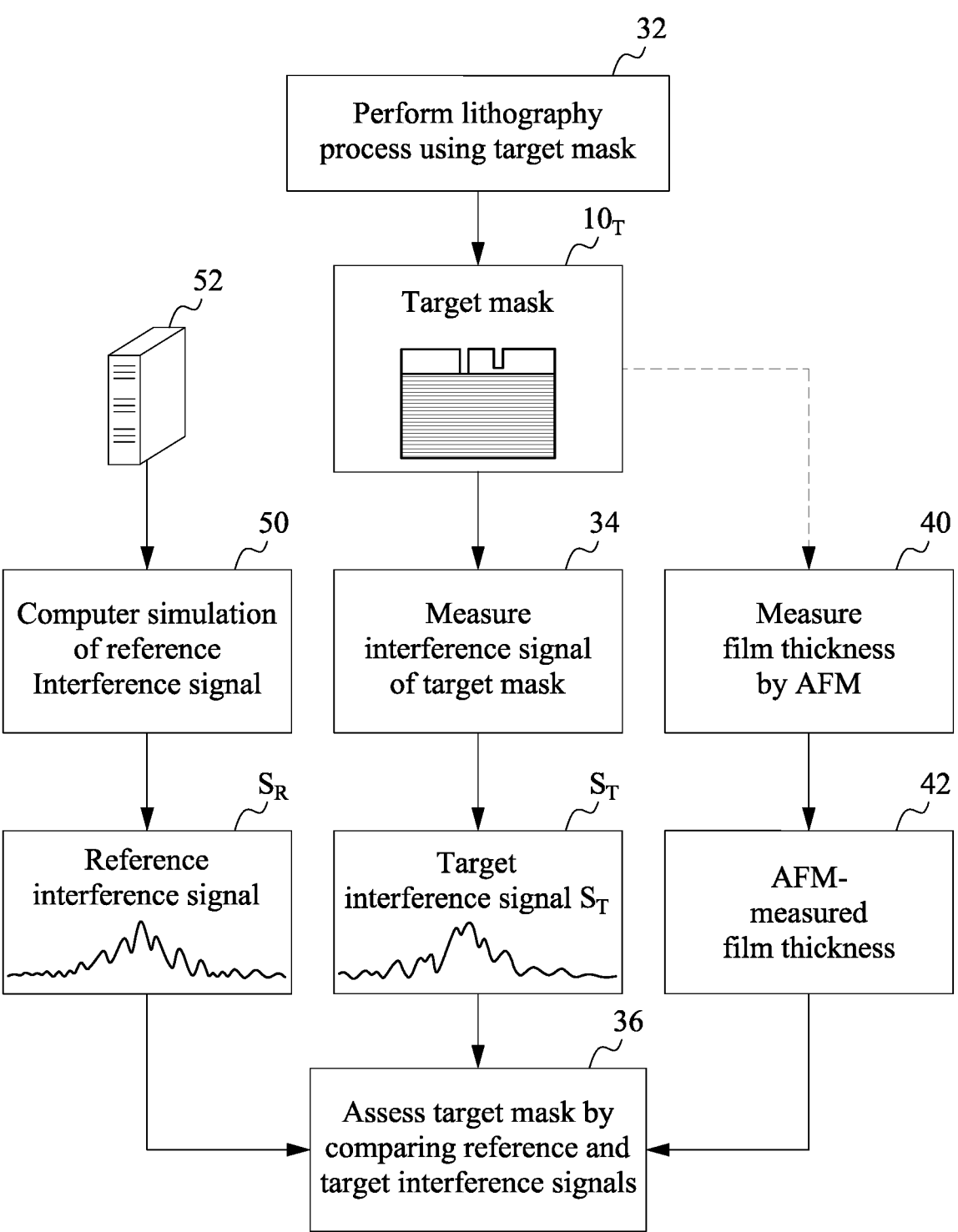
FIG. 7 diagrammatically illustrates a mask characterization method in accordance with some embodiments.

With reference to FIG. 7, the reference interference signal $S_R$ can alternatively be generated by computer simulation. The method of FIG. 7 includes operations 32, 34, 36, and optional operations 40, 42 as previously described with reference to FIG. 6 (and, again, the transmission target mask $10'_T$ could be measured using the apparatus of FIG. 3 in place of the illustrated target reflection mask $10_T$). However, in the method of FIG. 7 the physical reference mask $10_R$ (or $10'_R$) is not used, and the reference mask measurement operation 30 of FIG. 6 is replaced in the method of FIG. 7 by a computer simulation operation 50 performed by a computer 52 (which may be the same as, or different from, the electronic processor 18 of FIGS. 1-3). The computer simulation 50 can employ ray tracing, Monte Carlo simulation, or another optical system simulation formalism to simulate the reference interference signal $S_R$ for an input reference reflection (or transmission) mask design layout specifying information such as the geometrical layout of the areas A, optical properties of the material making up the absorbing layer 22 and reflectivity of the surface of the reflective multilayer stack 20 (or optical transmissivity of the substrate 21 in the case of a transmission mask), along with specification of the optical grating 14 or 15 (e.g., lines/mm at design-basis wavelength) and the incident light L1 (e.g., optical coherence and the center wavelength and, for a polychromatic light source, spectral characteristics such as full width-at-half-maximum, FWHM, or alternatively a specification of the spectrum of the light L1).

Figure 8:
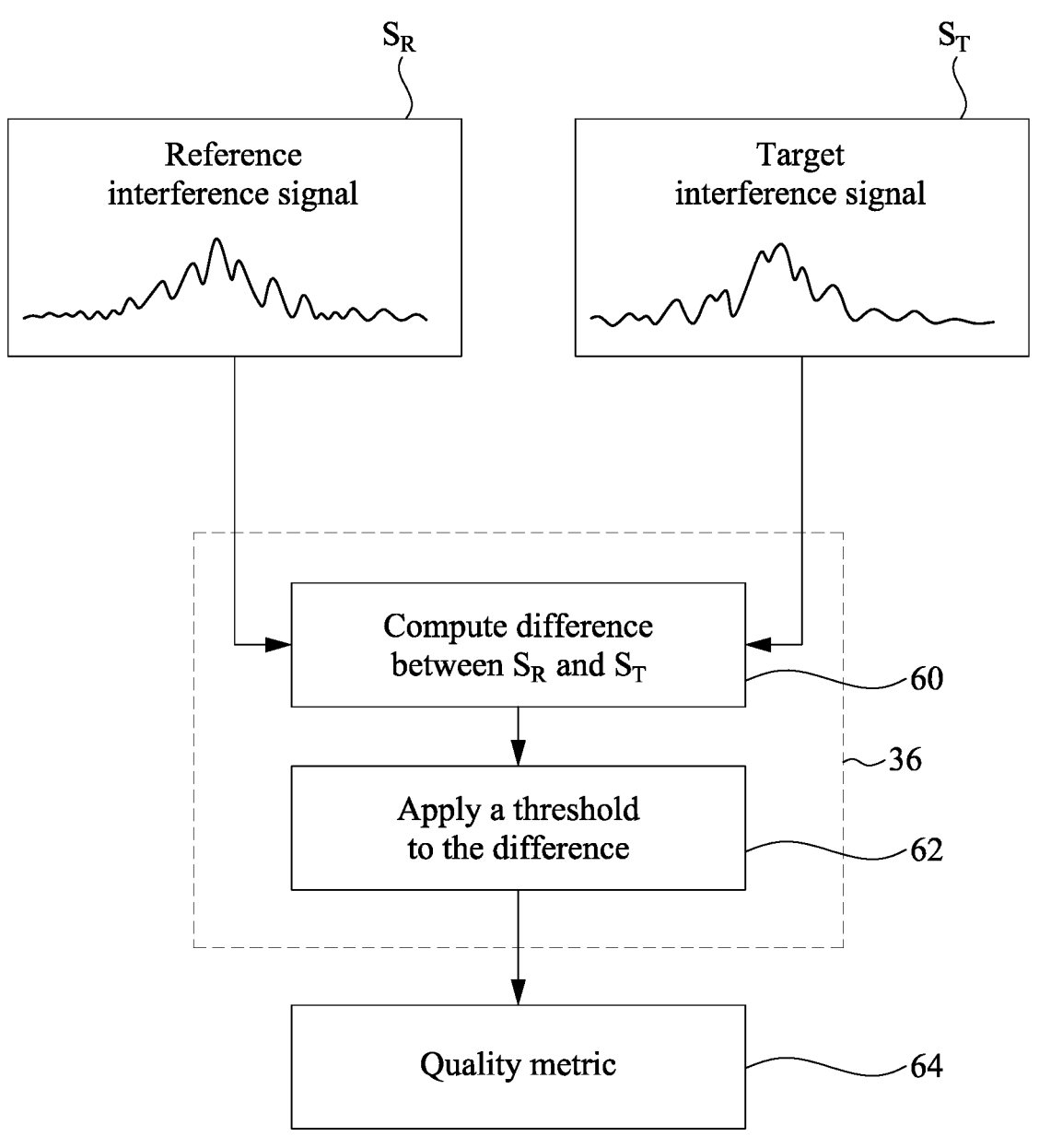
FIG. 8 diagrammatically illustrates an approach for determining a quality metric for a mask based on measured reference and target interference signals in accordance with some embodiments.

With reference to FIG. 8, one non-limiting illustrative embodiment of the target mask assessment operation 36 is described. In this embodiment, a difference between the reference interference signal $S_R$ and the target interference signal $S_T$ is computed in an operation 60, and a threshold is applied to this difference in an operation 62. If the difference computed in the operation 60 is less than the threshold applied in operation 62 then a quality metric 64 is set to indicate the target mask passes; whereas, if the difference computed in the operation 60 is greater than the threshold applied in operation 62 then the quality metric 64 is set to indicate the target mask fails. In this latter case, the fabricated mask or the mask under fabrication may be discarded, possibly along with all masks manufactured in a common fabrication batch.

The operation 60 may compute difference between the reference interference signal $S_R$ and the target interference signal $S_T$ in various ways. In one approach, the difference is computed as a mean squared error (MSE) as follows:

$$MSE = \frac{1}{N} \sum_{i=1}^{N} (s_{T,i} - s_{R,i})^2 \qquad (1)$$

where N is the count of data points in reference interference signal $S_R$ and the target interference signal $S_T$ (both signals being assumed to have the same number of data points), $s_{T,i}$ denotes the $i^{th}$ data point of the target interference signal $S_T$, and $s_{R,i}$ denotes the $i^{th}$ data point of the reference interference signal $S_R$. Optionally, the reference interference signal $S_R$ and the target interference signal $S_T$ may be preprocessed before computing the difference, for example by applying a high pass filter to remove low frequency (e.g., DC) components, and/or normalizing the filtered signals. Moreover, in the case of two-dimensional interference signals acquired using a two-dimensional grating and two-dimensional optical detector array, the summation of Equation (1) suitably runs over the datapoints in both dimensions, e.g. may be written as:

$$MSE = \frac{1}{M \times N} \sum_{j=1}^{M} \sum_{i=1}^{N} (s_{T,i,j} - s_{R,i,j})^2 \qquad (2)$$

where the subscripts i and j run over the respective dimensions of the two-dimensional interference signals.

Figure 9:
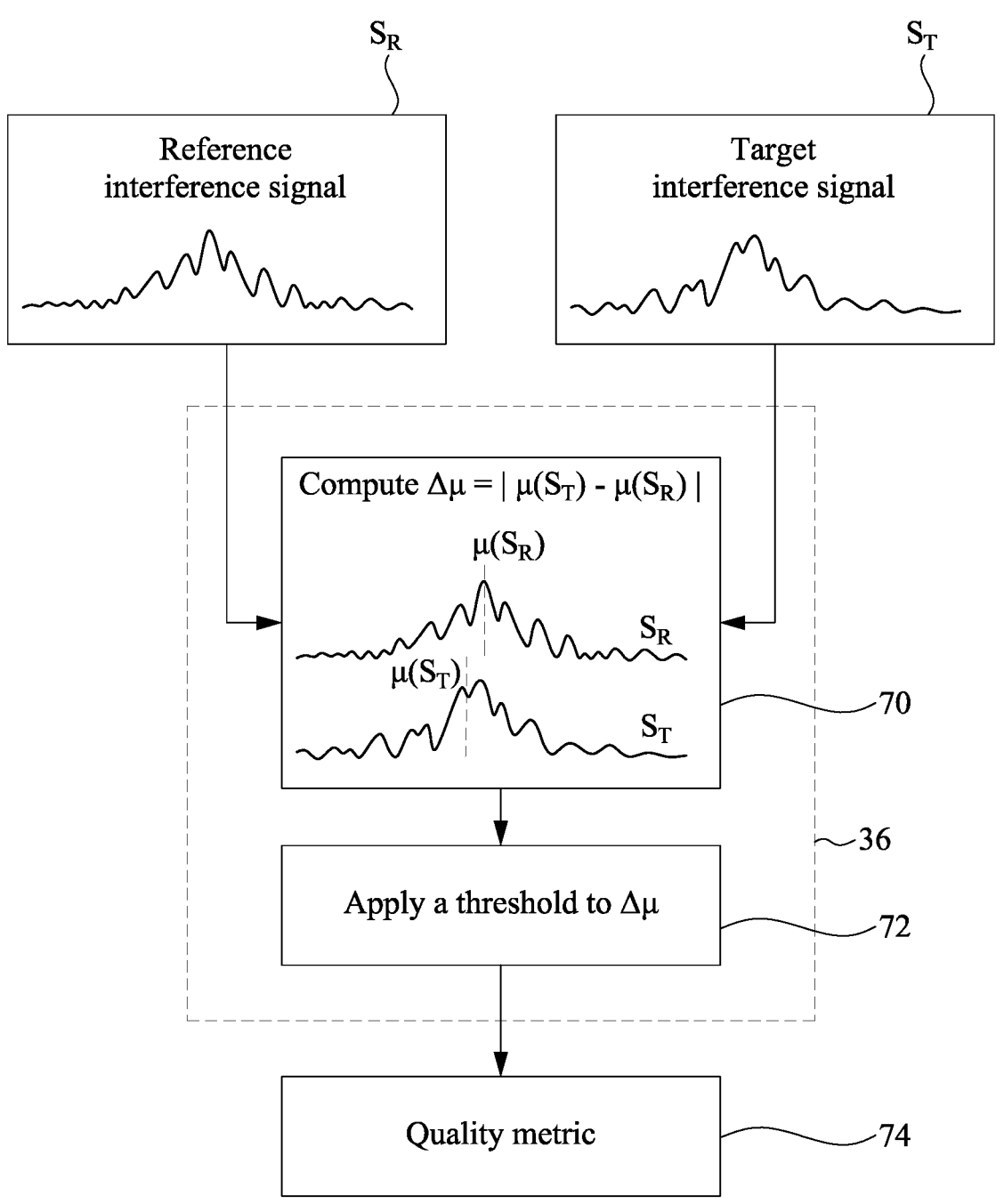
FIG. 9 diagrammatically illustrates an approach for determining a quality metric for a mask based on measured reference and target interference signals in accordance with some embodiments.

With reference to FIG. 9, another non-limiting illustrative embodiment of the target mask assessment operation 36 is described. In this embodiment, in an operation 70, a difference metric $\Delta\mu=|\mu(S_T)-\mu(S_R)|$ is calculated, where $\mu(S_T)$ is the mean value of the target interference signal $S_T$, and $\mu(S_R)$ is the mean value of the reference interference signal $S_R$. In an operation 72, a threshold is applied to this difference metric $\Delta\mu$. If the difference metric $\Delta\mu$ computed in the operation 70 is less than the threshold applied in operation 72 then a quality metric 74 is set to indicate the target mask passes; whereas, if the difference metric $\Delta\mu$ computed in the operation 70 is greater than the threshold applied in operation 72 then the quality metric 74 is set to indicate the target mask fails. Again, in this latter case various remedial actions may be taken.

The illustrative difference metrics of MSE (described with reference to FIG. 8) and $\Delta\mu$ described with reference to FIG. 9 are merely non-limiting illustrative difference metrics, and any of numerous other difference metrics could be applied in the operation 36.

Figure 10:
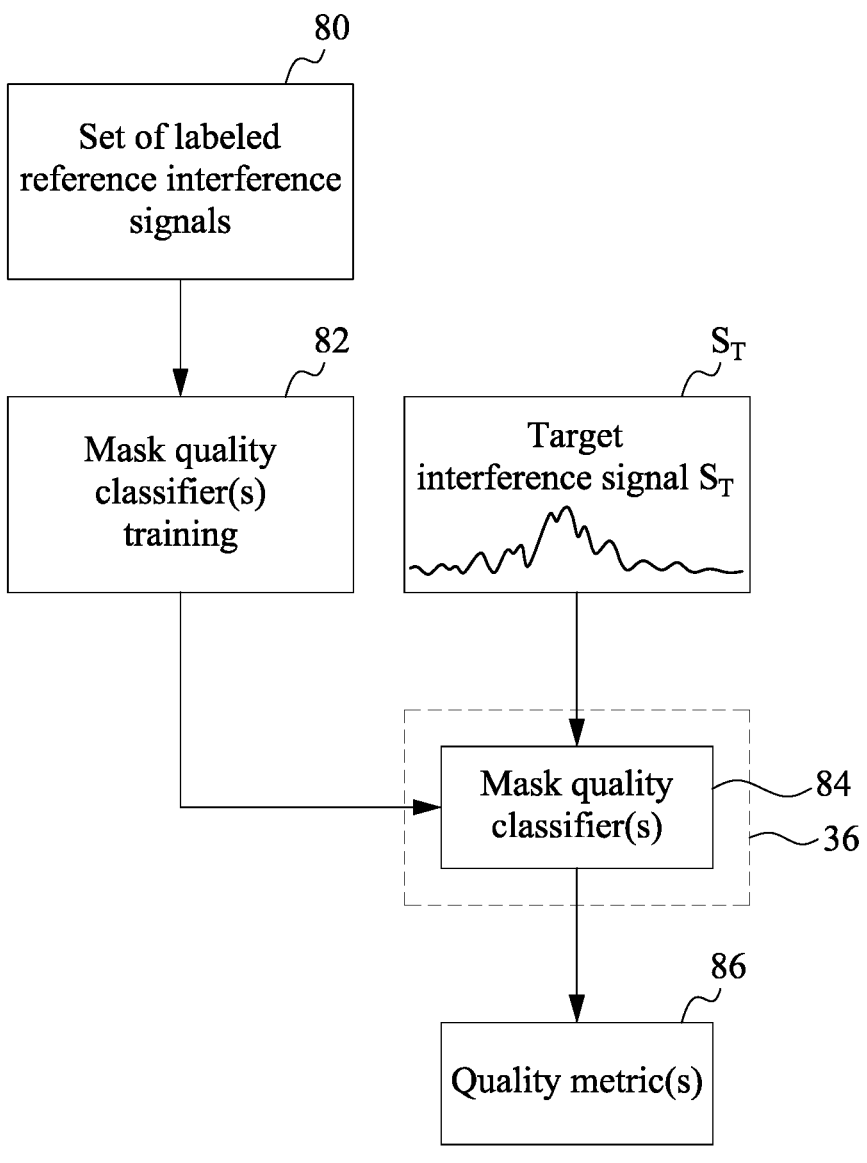
FIG. 10 diagrammatically illustrates an approach for determining a quality metric or metrics for a mask using machine learning in accordance with some embodiments.

With reference to FIG. 10, another non-limiting illustrative embodiment of the target mask assessment operation 36 is described. In this embodiment, a set of labeled reference interference signals 80 is obtained, for example by measuring the reference interference signal $S_R$ for one or more reference masks. Each reference interference signal of the set of reference interference signals 80 is labeled as to one or more characteristics of that reference mask at the time of measurement, such as whether it is acceptable for use in lithography, and/or as to information such as the thickness of the absorbing layer 22, reflectivity of the reflective multi-layer stack 20, and/or so forth. The labels are assigned based on information such as AFM measurements, optical properties measured using a synchrotron EUV light source, and/or so forth. In some embodiments, the set of labeled reference interference signals 80 includes both acceptable and unacceptable reference masks.

In another embodiment, the set of labeled reference interference signals 80 are generated by running the computer simulation operation 50 performed by the computer 52 as previously described with reference to FIG. 7. The simulations can be run for various simulated reference mask configurations specifying an input reference reflection (or transmission) mask design layout with credible variations in the geometrical layout of the areas A, optical properties of the material making up the absorbing layer 22 and reflectivity of the surface of the reflective multilayer stack 20 (or optical transmissivity of the substrate 21 in the case of a transmission mask), and so forth. The credible variations may encompass simulated reference mask configurations that are acceptable and simulated reference mask configurations that are unacceptable, in order to generate the set of labeled reference interference signals 80.

In an operation 82, one or more mask quality classifiers are trained on the set of labeled reference interference signals to output one or more mask quality metrics. The training adjusts parameters of a machine learning (ML) model (or models) to cause the classifier(s) to output mask quality metrics for the reference interference signals 80 that optimally agree with the labels. For example, the ML model may be a support vector machine (SVM) classifier with model parameters to be optimized including the normal vector w and offset b, or an artificial neural network (ANN) with model parameters to be optimized including neuron weights and activation functions, or so forth. The output of the training 82 is a trained mask quality classifier (or classifiers) 84. After the training 82, the trained mask quality classifier (or classifiers) 84 are suitably used to assess a target interference signal $S_T$ measured for a target mask by inputting the signal $S_T$ to the trained mask quality classifier (or classifiers) 84, which then output the quality metric (or metrics) 86 for the target mask.

As a non-limiting illustrative example, if in the training phase 82 the reference interference signals 80 are labeled as to pass/fail quality and absorbing layer thickness, then two classifiers may be trained: a binary classifier that outputs a pass-or-fail value, and a continuous value classifier that outputs absorbing layer thickness. Hence, when these trained mask quality classifiers 84 are applied in the mask assessment operation 36, two quality metrics 86 are output: a pass or fail metric, and an absorbing layer thickness metric. Again, this is merely a non-limiting illustrative example, and more generally the classifiers may be trained to predict various quality metrics depending upon availability of labeled reference interference signal training data.

The following discloses some further non-limiting illustrative embodiments.

In one non-limiting illustrative embodiment, a mask characterization method includes measuring an interference signal of a reflection or transmission mask for use in semiconductor lithography, and determining a quality metric for the reflection or transmission mask based on the interference signal.

In another non-limiting illustrative embodiment, a mask characterization method includes reflecting light from or transmitting light through a mask to generate reflected or transmitted light, reflecting the reflected or transmitted light from or transmitting the reflected or transmitted light through an optical grating to generate an interference pattern, and determining a quality metric for the mask based on the interference pattern.

In another non-limiting illustrative embodiment, a mask characterization apparatus includes a light source, an optical grating, and an optical detector array. The light source is arranged to illuminate a reflective or transmissive mask with light whereby mask-reflected or mask-transmitted light is generated. The optical grating is arranged to convert the mask-reflected or mask-transmitted light into an interference pattern. The optical detector array is arranged to generate an interference signal by measuring the interference pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask characterization method comprising:

reflecting only a single light beam from or transmitting only the single light beam through a reflection or transmission mask for use in semiconductor lithography to generate reflected or transmitted light;

reflecting the reflected or transmitted light from or transmitting the reflected or transmitted light through a single optical grating to generate an interference pattern;

measuring the interference pattern using an optical detector array;

using a computer, computing a reference interference pattern of a reference reflective mask using ray tracing or Monte Carlo simulation; and determining a quality metric for the reflection or transmission mask by comparing strength and regularity of interference fringes of the measured interference pattern with strength and regularity of interference fringes of the reference interference pattern.

2. The mask characterization method of claim 1 wherein the single light beam comprises spatially coherent light.

3. The mask characterization method of claim 1 wherein the single light beam has spatial coherence effective for the interference pattern to have the interference fringes of the measured interference pattern at least in a central region of the measured interference pattern.

4. The mask characterization method of claim 1 wherein the single light beam comprises a single extreme ultraviolet (EUV) light beam having a maximum spectral peak which is at a wavelength of 100 nm or shorter.

5. The mask characterization method of claim 1, further comprising:

measuring the reference interference pattern by reflecting only the single light beam from or transmitting only the single light beam through a reference reflection or transmission mask to generate reference reflected or transmitted light, generating the reference interference pattern from the reference reflected or transmitted light using the single optical grating, and measuring the reference interference pattern using the optical detector array.

6. The mask characterization method of claim 1 further comprising:

measuring the reference interference pattern of a reference reflective mask.

7. The mask characterization method of claim 1 further comprising:

using an atomic force microscope (AFM), acquiring an AFM image of the reflection or transmission mask;

wherein the quality metric for the reflection or transmission mask is determined further based on the AFM image of the reflection or transmission mask.

8. The mask characterization method of claim 1 further comprising:

prior to the comparing, applying a high pass filter to the measured interference pattern.

9. The mask characterization method of claim 1 wherein the single light beam has spatial coherence effective for the measured interference pattern to have the interference fringes at least in a central region of the measured interference pattern.

10. The mask characterization method of claim 1 wherein the comparing includes normalizing the measured interference pattern and the reference interference pattern.

11. The mask characterization method of claim 1 wherein the reference interference pattern of the reference reflective mask is computed using ray tracing.

12. The mask characterization method of claim 1 wherein the reference interference pattern of the reference reflective mask is computed using Monte Carlo simulation.

13. A mask characterization method comprising:

using a light source to illuminate a reflective or transmissive mask with only a single light beam whereby mask-reflected or mask-transmitted light is generated;

using an optical grating to convert the mask-reflected or mask-transmitted light into an interference pattern;

using an optical detector array to generate an interference signal by measuring the interference pattern; and using an electronic processor, determining a quality metric for the reflective or transmissive mask by:

computing a mean value $\mu(S_T)$ for the interference signal;

computing a mean value $\mu(S_R)$ for a reference interference signal for a reference reflective or transmissive mask obtained using the light source to illuminate the reference reflective or transmissive mask with only the single light beam, the optical grating, and the optical detector array; and determining the quality metric as a difference metric $\Delta\mu = |\mu(S_T) - \mu(S_R)|$.

14. The mask characterization method of claim 13 wherein the light source comprises a coherent light source having spatial coherence effective for the interference pattern to have interference fringes at least in a central region of the interference pattern.

15. The mask characterization method of claim 13 wherein:

the reflective or transmissive mask is a reflective mask;

the light source comprises an extreme ultraviolet (EUV) light source illuminating the reflective mask with only the single EUV light beam whereby mask-reflected EUV light is generated;

the optical grating is used to convert the mask-reflected EUV light into the interference pattern; and the optical detector is an EUV-sensitive optical detector array and is used to generate the interference signal by measuring the interference pattern.

16. The mask characterization method of claim 15 wherein the EUV light source does not comprise a synchrotron.

17. A mask characterization method comprising:

outputting extreme ultraviolet (EUV) light using a laser-produced plasma EUV (LPP-EUV) light source;

generating spatially coherent EUV light by filtering out selected spatial frequency components of the EUV light output by the LPP-EUV light source using spatial filtering;

measuring an interference pattern of an EUV reflection mask for use in EUV lithography by reflecting a single beam of the spatially coherent EUV light from the EUV reflection mask to generate reflected EUV light, generating an EUV interference pattern from the reflected EUV light using an optical grating, and measuring the interference pattern using an optical detector array;

using a computer, computing a reference interference pattern of a reference reflective mask using ray tracing or Monte Carlo simulation; and determining a quality metric for the EUV reflection mask based on a comparison between the measured interference pattern and the reference interference pattern.

18. The mask characterization method of claim 17 wherein the quality metric for the EUV reflection mask is determined based on a mean squared error (MSE) between the measured interference pattern and a reference interference pattern, and wherein one of:

the measured interference pattern is one-dimensional and $$MSE = \frac{1}{N} \sum_{i=1}^{N} (s_{T,i} - s_{R,i})^2$$

where N is the count of data points in measured interference pattern, $s_{T,i}$ denotes the $i^{th}$ data point of the measured interference pattern, and $s_{R,i}$ denotes the $i^{th}$ data point of the reference interference pattern; or the measured interference pattern is two-dimensional and $$MSE = \frac{1}{M \times N} \sum_{j=1}^{M} \sum_{i=1}^{N} (s_{T,i,j} - s_{R,i,j})^2$$

where the subscripts i and j run over respective first and second dimensions of the measured interference pattern.

19. The mask characterization method of claim 17 wherein the quality metric is determined by one of:

(i) comparing strength and regularity of interference fringes of the measured interference pattern with strength and regularity of interference fringes of the reference interference pattern; or (ii) computing a mean value for the measured interference pattern, computing a mean value for the reference interference pattern, and determining the quality metric as a difference between the mean value for the measured interference pattern and the mean value for the reference interference pattern.

20. The mask characterization method of claim 17 wherein the quality metric for the EUV reflection mask is determined by:

computing a mean value $\mu(S_T)$ for the measured interference pattern;

computing a mean value $\mu(S_R)$ for the reference interference pattern; and determining the quality metric as a difference metric $\Delta\mu = |\mu(S_T) - \mu(S_R)|$.

\* \* \* \* \*